United States Patent [19]

Araki et al.

[11] Patent Number: 4,700,173

[45] Date of Patent: Oct. 13, 1987

[54] ANALOG TO DIGITAL CONVERSION METHOD AND SYSTEM WITH THE INTRODUCTION AND LATER REMOVAL OF DITHER

[75] Inventors: Tetsuro Araki, Hachioji; Hiroyuki Onda, Hoya, both of Japan

[73] Assignee: Teac Corporation, Tokyo, Japan

[21] Appl. No.: 810,973

[22] Filed: Dec. 19, 1985

[30] Foreign Application Priority Data

Dec. 31, 1984 [JP] Japan .............................. 59-277692

[51] Int. Cl.$^4$ .............................................. H03M 1/20
[52] U.S. Cl. ........................ 340/347 AD; 340/347 CC
[58] Field of Search ................. 340/347 AD, 347 CC; 375/26, 34

[56] References Cited

U.S. PATENT DOCUMENTS 4,034,367 7/1977 Sugiyama .................... 340/347 AD

*Primary Examiner*—Charles D. Miller

*Attorney, Agent, or Firm*—Woodcock Washburn Kurtz Mackiewicz & Norris

[57] ABSTRACT

For the distortionless conversion of an audio or like data signal from analog to digital form as by pulse code modulation, the input data signal is time division multiplexed with an analog dither (white noise) signal to provide a multiplex signal composed of the analog dither signal and an analog data/dither signal, the latter being an addition of the analog data and dither signals. Then the multiplex signal is converted from analog to digital form by one and the same analog to digital converter. The subsequent removal of the digital dither component from the digital data/dither signal provides a digital data signal as a replica of the input analog data signal. The use of the same converter for the conversion of both dither signal and data/dither signal from analog to digital form makes possible the maximum possible removal of the dither from the digital data/dither signal.

10 Claims, 4 Drawing Figures

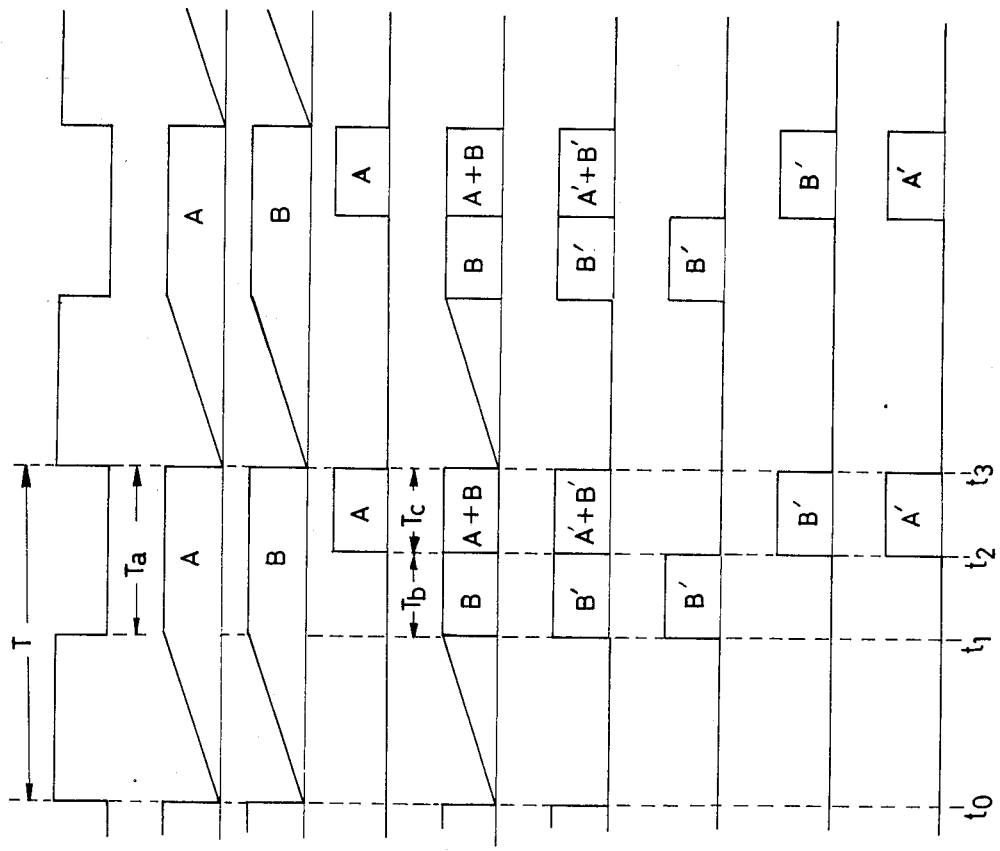

ANALOG TO DIGITAL CONVERSION METHOD AND SYSTEM WITH THE INTRODUCTION AND LATER REMOVAL OF DITHER

BACKGROUND OF THE INVENTION

Our invention relates to the conversion of electric signals from analog to digital form. More specifically, our invention concerns a method of, and means for translating an analog audio or like data signal into an equivalent digital signal with the addition of dither (an artifically created white noise signal) to the analog input and subsequent removal of the dither from the digital output for the reduction of noise and distortion.

The pulse code modulation (PCM) or digital processing of audio signals has become, or is becoming, the mainstream of high fidelity sound recording and reproduction with the advent and ever increasing commercial acceptance of compact discs (CDs). There are, however, some problems left unsolved in the art of digital sound processing. One of these is the "quantization noise", that is, the difference between the samples of the music wave and the quantized values of the samples. The quantization noise becomes particularly pronounced, distorting the reproduced sound as higher harmonics, when the input signal level is low and there are only a small number of quantization steps. Even when the input signal level is high, the quantization noise will distort the signal if it changes slowly.

A conventional solution to this quantization noise problem has been the use of dither, intended to turn the quantization noise into white noise which hardly effects the appreciation of the reproduced sound. An analog dither signal is superposed on the audio signal prior to its digitization and may, or may not, be removed from the digitized audio signal. This technique is disclosed for example in the article entitled "The Application of Large Amplitude Dither to the Quantization of Wide Range Audio Signals" by Yoshio Yamasaki in *The Journal of the Acoustical Society of Japan.* Vol 39, No. 7, published 1983, and in Japanese Laid Open Patent Application No. 50-68258.

We will now discuss two familiar examples of analog to digital conversion systems relying on dither for the suppression of quantization noise. One such known system adds an analog dither signal, converted from the output from a digital dither generator by a digital to analog (D/A) converter, to the incoming analog audio or data signal. The combined data and dither signal is then digitized by an analog to digital (A/D). Then the analog data and dither signal is fed to a subtracter circuit, to which is also supplied the digital dither signal directly from the dither generator for subtracting the dither component from the digital data and dither signal. We object to this known system not only because of the use of the D/A converter for transforming the digital dither signal but also because of the time difference between the dither fed directly from the dither generator to the substracter circuit and the dither delivered thereto with the data signal via the D/A converter, adder circuit, and A/D converter. This time difference makes impossible the complete removal of the dither component from the digitized data and digher signal because of the resulting phase difference between the dither fed directly from its generator and that which has been added to the data signal.

Another known system employs an analog dither generator in combination with a second A/D converter for digitizing the analog dither prior to its delivery to the subtracter. Although the analog dither put out by the generator can be fed directly to the adder circuit, the resulting dither added data signal is digitized by the first A/D converter, and the analog dither by the second A/D converter, preparatory to application to the two inputs of the subtracter circuit. We object to the use of the two A/D converters. Since no two A/D converters are absolutely alike in performance characteristics, they will give rise to different convertion errors, with the result that some dither component remain unremoved from the digital data signal to manifest itself as noise or distortion upon sound reproduction.

SUMMARY OF THE INVENTION

We have hereby discovered how to add dither to, and completely remove the same from, the desired audio or like data signal for faithfully reconstructing the digital equivalent of the analog data signal, by use of relatively simple and thoroughly practicable means.

According to our invention, briefly stated in one aspect thereof, there is provided a method of faithfully converting an analog audio or like data signal into a digital equivalent. The method comprises time division multiplexing an analog dither signal and an analog data/dither signal, the latter being an addition of the analog data signal and the analog dither signal. Then the multiplexed analog dither signal and analog data/dither signal is converted into digital form by means of one and the same D/A converter. Then the digital dither component is removed from the digital data/dither signal to obtain a digital data signal representative of the analog data signal.

Another aspect of our invention concerns an analog to digital conversion system for carrying the above summarized method into practice. The system comprises time division multiplexing means connected both to input means, through which an analog data signal is received, and to a source of an analog dither signal for time division multiplexing the analog dither signal and the analog data/dither signal. An A/A converter is connected to the time division multiplexing means for digitizing the multiplexed dither signal and data/dither signal to provide an output comprised of a digital dither signal and a digital data/dither signal. Connected to the D/A converter are dither removing circuit means for removing the digital dither component from the digital data/dither signal to provide a digital data signal representative of the analog data signal.

It should be noted that the dither signal and the data/dither signal are time division multiplexed for conversion from analog to digital form by the same A/D converter. There is accordingly no difference between the conversion errors of the dither signal and those of the data/dither signal, resulting in the remarkable curtailment of noise or distortion. There can be utilized, of course, the digital dither signal extracted from the output from the A/D converter for the complete removal of the dither component from the data/dither signal following the analog to digital conversion.

The above and other features and advantages of our invention and the manner of realizing them will become more apparent, and the invention itself will best be understood, from a study of the following description and appended claims, with reference had to the attached drawings showing some preferred embodiments of our invention.

BRIEF DESCRIPTION OF THE DRAWINGS

FIG. 4 is a timing diagram showing in proper time relationship the signals appearing in the various parts of the analog to digital conversion system of FIG. 3 in order to explain its operation.

DETAILED DESCRIPTION

Figure 1:
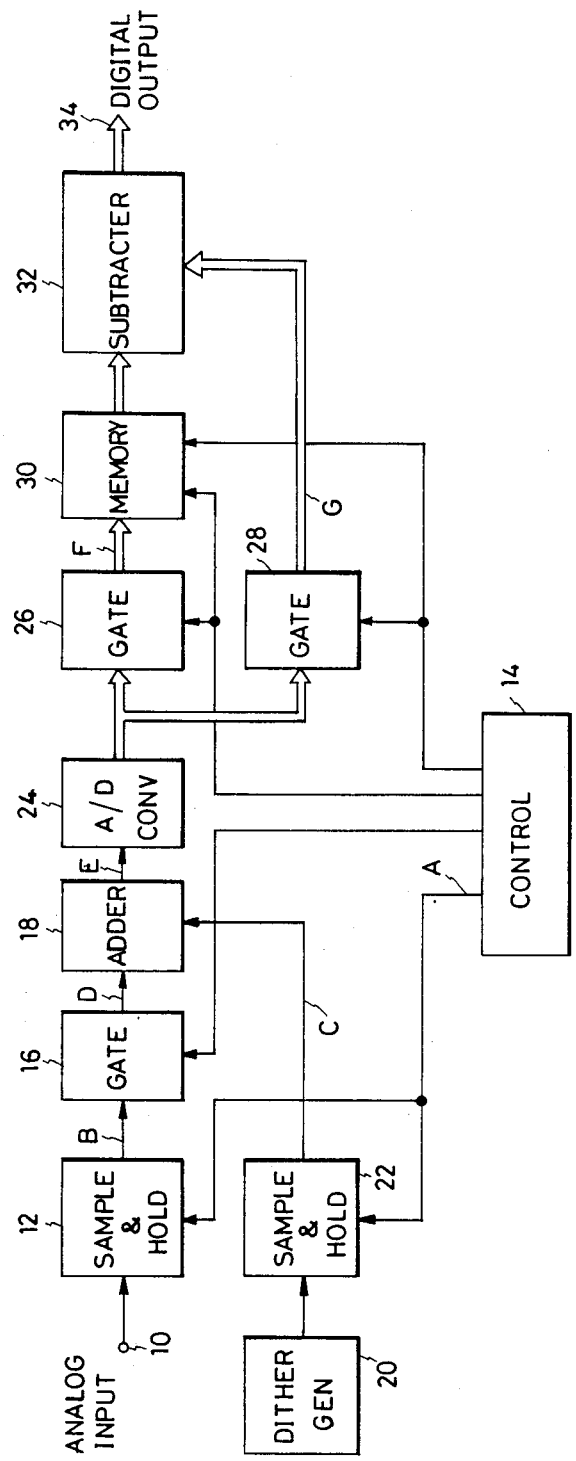
FIG. 1 is a block diagram of the analog to digital conversion system embodying the principles of our invention.

We will now describe our invention in terms of a first preferable embodiment thereof given in FIG. 1, in which the analog to digital conversion system of our invention is shown adapted for use in the PCM recording of an audio signal. In the course of the discussion of FIG. 1 we will refer also to FIG. 2 which plots at (A) through (C) the signal useful in explaining the operation of the FIG. 1 system. In FIG. 1, moreover, we have indicated by the same capitals (A) through (G) the parts where the corresponding signals of FIG. 2 appear, for the case of the understanding of our invention.

The reference numeral 10 in FIG. 1 denotes an input terminal for inputting the analog audio or data signal, with frequencies normally ranging from zero to 20 kilohertz, to be transformed into an equivalent digital signal. We are using the term "data signal" to mean any such signal that can be processed by the method and means of our invention.

The input terminal 10 is connected to a sample and hold circuit 12 which has a control input connected to a control circuit 14. We have indicated at (A) in FIG. 2 a series of sampling pulses delivered from control circuit 14 to sample and hold circuit 12. Each sampling pulse lasts as from moment t0 to moment t1, from moment t3 to moment t4, etc. We will refer to the period from moment t0 to moment t3, etc., as one cycle T of the sampling pulses, and to the period from moment t1 to moment t3, etc., as an interval Ta between the sampling pulses. The output from the sample and hold circuit 12 is given at (B) in FIG. 2. It will be observed that the sample and hold circuit 12 samples the input analog data signal A in response to each sampling pulse and holds the sample during each sampling interval Ta. The output from the sample and hold circuit 12 is constant only during each sampling interval Ta.

The sample and hold circuit 12 is connected to a gate circuit 16, which also has a control input connected to the control circuit 14. The gating pulses delivered from control circuit 14 to gate circuit 16 are such that the gate circuit allows the passage therethrough of the output from the sample and hold circuit 12 only during the first of two predetermined divisions Tb and Tc of each sampling interval Ta, as indicated at (D) in FIG. 2. The first division Tb of each sampling interval Ta lasts from moment t1 to moment t2, and the second division Tc from moment t2 to moment t3. It may be noted that the gate circuit 16 selects only part of each constant level sample of the analog data signal A put out by the sample and hold circuit 14.

The gate circuit 16 is connected to one input of an adder circuit 18, to another input of which is connected an analog dither generator 20 via another sample and hold circuit 22. We will call this second sample and hold circuit as the dither sample and hold circuit by way of contradistinction from the first recited sample and hold circuit 12, to which we will then refer as the data sample and hold circuit.

The dither generator 20 generates and puts out an analog dither (white noise) signal composed of various frequency components ranging from, say, zero to 300 kilohertz, at a relatively low level. The dither sample and hold circuit 22 has a control input connected to the control circuit 14 to receive therefrom a series of sampling pulses akin to those delivered to the data sample and hold circuit 12. Thus the dither sample and hold circuit 22 produces the output shown at (C) in FIG. 2, periodically sampling the analog dither signal B as from moment t0 to moment t1 and holding the sample during each sampling interval Ta.

The adder circuit 18 adds the analog data signal from the gate circuit 16 and the analog dither signal from the dither sample and hold circuit 22. As shown at (D) in FIG. 2, the gate circuit 16 puts out the analog data signal A during the first division Tb of each sampling interval Ta. As will be seen from (C) in FIG. 2, on the other hand, the dither sample and hold circuit 22 puts out the constant level analog dither signal B during each sampling interval Ta. The resulting output from the adder circuit 18 is therefore as represented at (B) in FIG. 2. The adder circuit 18 puts out an addition (A+B) of the analog data signal A and analog dither signal B during the first division Tb of each sampling interval Tu, and the analog dither signal B during the second division Te of each sampling interval. We will refer to the addition (A+B) of the analog data and dither signals as the data/dither signal. The output from the adder circuit 18 during the period from moment t0 to moment t1 is unstable and is to be eliminated subsequently. It can be stated, then, that the output from the adder circuit 18 is essentially a time division multiplexing of the analog data/dither signal (A+B) and the dither signal B. The data sample and hold circuit 12, gate circuit 16, dither sample and hold circuit 22, and adder circuit 16 constitute in combination the means for time division multiplexing the analog data/dither signal and the dither signal in accordance with our invention.

Connected to the output of the adder circuit 18 is an A/D converter 24 which transforms the multiplex output signal from the adder circuit from analog to digital form. The output from this A/D converter 24 is therefore a time division multiplexing of a digital data/dither signal, during the first division Tb of the sampling interval Ta, and a digital dither signal during the second division Te thereof, as well as the unstable component as from moment t0 to moment t1. The multiplex digital output from the A/D converter 24 may be of 16 bits, delivered in parallel.

The A/D converter 24 is connected to both gate circuits 26 and 28. The first gate circuit 26 functions to extract the data/dither signal from the output from the A/D converter 24, and the second gate circuit 28 to extract the dither signal from the A/D converter output. We will therefore refer to the first gate circuit 26 as the data/dither gate circuit, and to the second gate circuit 28 as the dither gate circuit. The data/dither gate circuit 26 has a control input connected to the control circuit 14 to receive therefrom a series of gating pulses each lasting during the first division Th of each sampling interval Ta. The data/dither gate circuit 26 responds to these gating pulses to allow the passage therethrough of only the digital data/dither signal (A'+B'), given at (F) in FIG. 2, which is contained in the multiplex output from the A/D converter 24.

The dither gate circuit 28 also has a control input connected to the control circuit 14 to receive therefrom a series of gating pulses each lasting during the second division Tc of each sampling interval Ta. In response to these gating pulses the dither gate circuit 28 extracts the digital dither signal B' from the multiplex output from the A/D converter 24, as shown at (G) in FIG. 2.

The data/dither gate circuit 26 has its output connected to a memory 30 which functions as a kind of delay circuit for synchronizing the data/dither signal (A'+B') from the data/dither gate circuit 26 with the dither signal B' from the dither gate circuit 28 preparatory to the delivery of the data/dither signal to a subtracter circuit 32. The memory 30 has two control inputs connected to the control circuit 14 to receive write and read commands therefrom. The write command is impressed to the memory 30 during the first division Th of each sampling interval Ta, so that the digital data/dither signal (A'+B') from the data/dither gate circuit 26 is written into the memory. Then the control circuit 14 applies the read command to the memory 30 during the second division Tc of each sampling interval Ta, causing the stored data/dither signal to be read out in synchronism with the dither signal B' being put out by the dither gate circuit 28.

Thus the subtracter circuit 32 inputs the synchronized digital data/dither signal (A'+B') and dither signal B' from the memory 30 and dither gate circuit 28. Subtracting the digital dither signal B' from the digital data/dither signal (A'+B'), the subtractor circuit 32 puts out the desired digital data signal A' over an output path 34.

Figure 2:
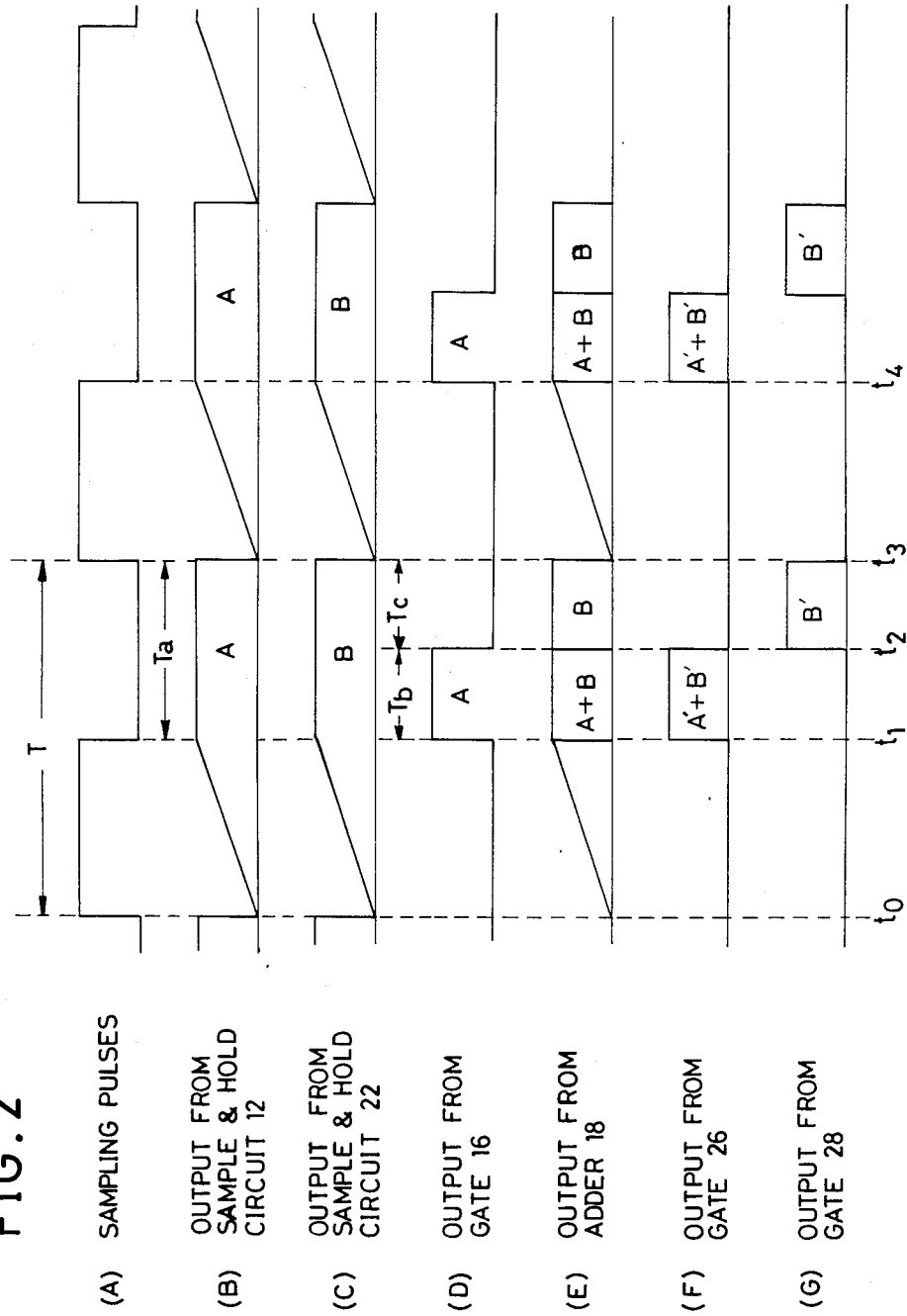
FIG. 2 is a timing diagram showing in proper time relationship the signals appearing in the various parts of the analog to digital conversion system of FIG. 1 in order to explain its operation.

One of the features of the analog to digital conversion system of FIG. 1 is the time division multiplexing of the analog data/dither signal (A+B) and analog dither signal B, as we have explained with reference to (E) in FIG. 2. The multiplexed analog data/dither signal (A+B) and analog dither signal B can be translated into digital signals by the same A/D converter 24 and, in consequence, without any difference between the conversion errors of the data/dither signal and those of the dither signal; in other words, the two signals are converted with the same conversion errors.

Another feature of the FIG. 1 system is that the subtractor circuit 32 uses the digital dither signal that has been derived from the multiplex output from the A/D converter 24, for removing the dither component from the digitized data/dither signal. Toward this end the multiplex analog output from the A/D converter 24 is divided into the data/dither signal (A'+B') and the dither signal B' by the gate circuits 26 and 28, preparatory to delivery to the subtracter circuit 32. Since the two outputs to the subtracter circuit 32 have been derived from the output from the same A/D converter 24 and so possess the same conversion errors as aforesaid, the dither component is thoroughly removable from the digitized data/dither signal without the difficulties previously set forth in conjunction with the prior art.

SECOND FORM

Figure 3:
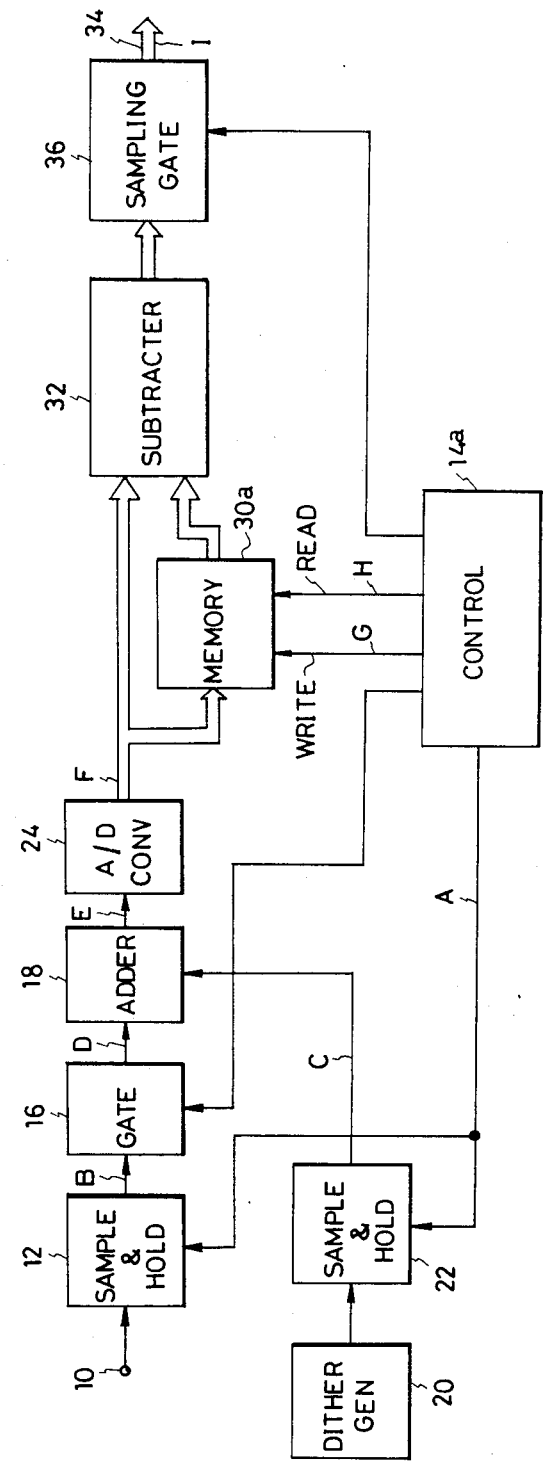
FIG. 3 is a block diagram of another preferred form of the analog to digital conversion system in accordance with our invention.

We have illustrated in FIG. 3 another preferred form of the analog to digital conversion system in accordance with our invention. This second system also comprises the analog data input terminal 10, data sample and hold circuit 12, gate circuit 16, adder circuit 18, and A/D converter 24, which are connected sequentially in the order named. Also, as in the foregoing embodiment, the analog dither generator 20 is connected via the dither sample and hold circuit 22 to the adder circuit 18. The two sample and hold circuits 12 and 22 and the gate circuit 16 are under the control of a control circuit 14a having slightly different control functions from those of the control circuit 14 of the FIG. 1 system.

The A/D converter 24 is connected directly to one input of the subtractor circuit 32 on one hand and, on the other hand, to the other input of the subtractor circuit via a memory 30a. Connected to the control circuit 14a to receive write and read commands to be set forth presently, the memory 30a in this alternative embodiment functions to impart a delay to the digitized dither signal for synchronizing the same with the digitized data/dither signal. The subtracter circuit 32 has its output connected to a sampling gate circuit 36 and thence to the digital output path 34, the sampling gate circuit 36 is effective to derive the 14a, the sampling gate circuit 36 is effective to derive the desired digital data signal from the output from the subtracter circuit 32.

We have indicated in FIG. 4 the various signals, designated (A) through (I), appearing in those parts of the FIG. 3 system which are identified by the same capitals, for a better understanding of the following operational description of this system. At (A) in FIG. 4 is shown the sample sampling pulses as those used in the FIG. 1 embodiment for causing the data sample and hold circuit 12 and dither sample and hold circuit 22 to produce the outputs A and B given at (B) and (C), respectively, in FIG. 4.

However, in this alternative embodiment, the gate circuit 16 is so controlled by the control circuit 14a that the data signal A is put out during the second division Tc of each sampling interval Ta, as at (D) in FIG. 4, instead of during the first division Tb thereof as in the foregoing embodiment. Thus the adder circuit 18 inputs the gate circuit output of FIG. 4(D) and the dither sample and hold circuit output of FIG. 4(C). The resulting output from the adder circuit 18 is therefore as plotted at (B) in FIG. 4. It will be seen that the adder circuit output is a time division multiplexing of the dither signal B, during the first division Tb of each sampling interval Ta, and the data/dither signal (A+B) during the second division Tc of each sampling interval, as well as the unstable component as from moment t0 to moment t1.

The time multiplexed dither signal B and data/dither signal (A+B) are delivered to the A/D converter 24, thereby to be converted from analog to digital form. Therefore, as indicated at (F) in FIG. 4, the output from the A/D converter 24 is a time division multiplexing of the digital dither signal B' and digital data/dither signal (A'+B').

The memory 30a inputs a write command during the first division Tb of each sampling interval to store the digital dither signal B' contained in the multiplex output from the A/D converter 24. The stored dither signal is read out from the memory 30a as the control circuit 14 applies a read command during the second division Tc of each sampling interval, as at (H) in FIG. 4, with the result that the digital dither signal B' from the memory 30a is in synchronism with the digital data/dither signal (A'+B') contained in the multiplex output of FIG. 4(F) from the A/D converter 24.

The subtracter circuit 32 inputs the FIG. 4(F) output from the A/D converter 24 and the FIG. 4(H) output from the memory 30a. Since the digital dither signal B' from the memory 30a has been synchronized with the digital data/dither signal (A'+B') of the multiplex output from the A/D converter 24, the substracter circuit 36 puts out only the digital data signal A' during the second division Tc of each sampling interval. The output from the subtracter circuit 36 contain other undesired signal components during the other period of each sampling cycle T. We have therefore employed in this alternative embodiment the sampling gate circuit 36 for the removal of such undesired signal components. Responding to a sampling pulse delivered from the control circuit 14a during the second division Tc of each sampling interval, the sampling gate circuit 36 extracts only the desired digital data signal A' as represented at (I) in FIG. 4. for delivery over the output path 34.

Thus, in this alternative embodiment, as in the FIG. 1 embodiment, the analog data/dither signal (A+B) and analog dither signal B are time multiplexed and converted into digital form by the same A/D converter 24. Further the subtracter circuit 32 removes the digitized dither signal B' from the digitized data/dither signal (A'+B') by utilizing the digital dither signal that has been extracted from the muliplex output from the A/D converter by the memory 30a. It is therefore apparent that this FIG. 3 embodiment gains the same advantages as those set forth in connection with that of FIG. 1.

POSSIBLE MODIFICATIONS

Although we have shown and described our invention in terms of but two preferable embodiments thereof, we recognize, of course, that our invention could be embodied in other forms within the broad teaching hereof. It will also be apparent that our invention is adaptable for the digital to analog convesion of not only audio signals but also video and a variety of other signals. The following is a brief list of possible modifications or alterations of the illustrated embodiments which we believe fall within the scope of our invention:

1. The gate circuit 12 in both FIGS. 1 and 3 embodiments could be connected on the output side, instead of the input side, of the adder circuit 18 for gating the analog data/dither signal put out by the adder circuit. Further, in this case, a sampling gate might be connected between the dither sample and hold circuit 22 and the A/D converter 24 for sampling the analog dither signal. Then the analog data/dither signal and the analog dither signal would be input to the D/A converter 22 by time division multiplexing.
2. The memory 30 of the FIG. 1 embodiment could be used for delaying the digital dither signal for synchronizing the same with the digital data/dither signal.
3. The memory 30a of the FIG. 3 embodiment could likewise be used for delaying the digital data/dither signal for synchronizing the same with the digital dither signal.
4. The analog dither generator 20 might be replaced by a combination of a digital dither generator, such as a maximum sequence pseudorandom pulse generator, and a D/A converter.

We claim:

1. A method of faithfully converting an analog audio or like data signal into an equivalent digital signal, which comprises:
   (a) generating an analog dither signal;
   (b) time division multiplexing the analog dither signal and an analog data/dither signal, the latter being an addition of the analog data signal and the analog dither signal;
   (c) converting the multiplexed analog dither signal and analog data/dither signal into a multiplex output, the multiplex output comprising a digital dither signal and a digital data/dither signal by means of one and the same analog to digital converter: and
   (d) removing the digital dither component from the digital data/dither signal to obtain a digital data signal representative of the analog data signal.

2. The analog to digital conversion method of claim 1 wherein the digital dither component is removed from the digital data/dither signal by:
   (a) extracting the digital dither signal from the multiplex output from the analog to digital converter; and
   (b) utilizing the extracted digital dither signal for the removal of the digital dither component from the digital data/dither signal.

3. The analog to digital conversion method of claim 1 wherein the digital dither component is removed from the digital data/dither signal by:
   (a) extracting the digital data/dither signal from the multiplex output from the analog to digital converter;
   (b) also extracting the digital dither signal from the multiplex output from the analog to digital converter;
   (c) synchronizing the extracted digital data/dither signal and digital dither signal with respect to each other; and
   (d) introducing the synchronized digital data/dither signal and digital dither signal to a subtracter circuit.

4. The analog to digital conversion method of claim 1 wherein the digital dither component is removed from the digital data/dither signal by:
   (a) extracting either of the digital data/dither signal and the digital dither signal from the multiplex output from the analog to digital converter;
   (b) synchronizing the extracted one of the digital data/dither signal and the digital dither signal with the other:
   (c) introducing into a subtracter circuit both the multiplex output from the analog to digital converter and the extracted one of the digital data/dither signal and the digital dither signal which has been synchronized with the other, for the removal of the dither component from the digital data/dither signal contained in the multiplex output from the analog to digital converter; and
   (d) extracting the digital data signal from the output from the substractor circuit.

5. A method of faithfully converting an analog audio or like data signal into an equivalent digital signal, which comprises:
   (a) generating an analog dither signal;
   (b) time division multiplexing the analog dither signal and an analog data/dither signal, the latter being an addition of the analog data signal and the analog dither signal by (i) sampling the incoming analog data signal;
(ii) holding each sample of the analog data signal during a predetermined sampling interval;
(iii) gating the samples of the analog data signal to select a portion of each sample during a predetermined part of the predetermined sampling interval;
(iv) sampling the generated analog dither signal in synchronism with the sampling of the analog data signal;
(v) holding each sample of the analog dither signal during the same sampling interval as each sample of the analog data signal;
(vi) adding the gated samples of the analog data signal and the held samples of the analog dither signal, whereby the analog data/dither signal is transmitted during the predetermined part of each sampling interval, and the analog dither signal during the rest of each sampling interval;
(c) converting the muliplexing analog dither signal and analog data/dither signal into a digital dither signal and a digital data/dither signal by means of one and the same analog to digital converter; and
(d) removing the digital dither component from the digital data/dither signal to obtain a digital data signal representative of the analog data signal.

6. A system for faithfully converting an analog audio or like data signal into an equivalent digital signal, comprising:
(a) input means for receiving the analog data signal;
(b) a source of an analog dither signal;
(c) time division multiplexing means connected both to the input means and to the source for time division multiplexing the analog dither signal and an analog data/dither signal, the latter being an addition of the analog data signal and the analog dither signal;
(d) an analog to digital converter connected to the time division multiplexing means for converting the multiplexed dither signal data/dither signal from analog to digital form to provide an output comprised of a digital dither signal and a digital data/dither signal; and
(e) dither removing circuit means connected to the analog to digital converter for removing the digital dither component from the digital data/dither signal to provide a digital data signal representative of the analog data signal.

7. The analog to digital conversion system of claim 6 wherein the time division multiplexing means comprises:
(a) a gate circuit connected to the input means for permitting the selective passage therethrough of the analog data signal during predetermined periods of time at predermined time intervals; and
(b) an adder circuit connected to both the gate circuit and the source for adding the outputs therefrom.

8. The analog to digital conversion system of claim 6 wherein the time division multiplexing means comprises:
(a) a first sample and hold circuit connected to the input means for periodically sampling the incoming analog data signal and for holding each sample during a predetermined sampling interval:
(b) a gate circuit connected to the first sample and hold circuit for permitting the selective passage therethrough of each sample of the analog data signal during a predetermined part of the predetermined sampling interval:
(c) a second sample and hold circuit connected to the source for periodically sampling the incoming analog dither signal in synchronism with the sampling of the analog data signal by the first sample and hold circuit and for holding each sample of the analog dither signal during the same sampling interval as each sample of the analog data signal; and
(d) an adder circuit connected to both the gate circuit and the second sample and hold circuit for adding the outputs therefrom.

9. The analog to digital conversion system of claim 6 wherein the dither removing circuit means comprises:
(a) a first gate circuit connected to the analog to digital converter for extracting the digital data/dither signal from the output therefrom;
(b) a second gate circuit connected to the analog to digital converter for extracting the digital dither signal from the output therefrom;
(c) a memory connected to either of the first and second gate circuits for temporarily storing either of the extracted digital data/dither signal and digital dither signal, the stored signal being read out from the memory in synchronism with the extraction of the other of the digital data/dither signal and the dither signal by the other of the first and second gate circuits; and
(d) a subtracter circuit connected to both the memory and said other of the first and second gate circuits for subtracting the digital dither component from the digital data/dither signal.

10. The analog to digital conversion system of claim 6 wherein the dither removing circuit means comprises:
(a) a memory connected to the analog to digital converter for temporarily storing either of the digital data/dither signal and the digital dither signal included in the output therefrom, the stored signal being read out from the memory in synchromism with the delivery of the other of the digital data/dither signal and the digital dither signal from the analog to digital converter;
(b) a subtracter circuit connected to both the analog to digital converter and the memory for removing the dither component from the digital data/dither signal contained in the output from the analog to digital converter, by utilizing the output from the memory; and
(c) a sampling gate circuit connected to the subtracter circuit for extracting the digital data signal from the output from the subtracter circuit.

* * * * *